US008936462B2

(12) United States Patent
Sheu et al.

(10) Patent No.: US 8,936,462 B2
(45) Date of Patent: Jan. 20, 2015

(54) MULTI-OPERATION WAFER BAKING SYSTEM

(75) Inventors: Walong Sheu, Taoyuan (TW); Chin-Chuang Chang, Taoyuan (TW)

(73) Assignee: Chen Long Technology Corp. Ltd., Taoyuan County (TW)

( * ) Notice: Subject to any disclaimer, the term of this patent is extended or adjusted under 35 U.S.C. 154(b) by 928 days.

(21) Appl. No.: 12/900,476

(22) Filed: Oct. 8, 2010

(65) Prior Publication Data

US 2012/0021368 A1  Jan. 26, 2012

(30) Foreign Application Priority Data

Jul. 23, 2010  (TW) ............................... 99214020 U

(51) Int. Cl.
*F27D 99/00* (2010.01)
*F27B 17/00* (2006.01)
*H01L 21/677* (2006.01)
*H01L 21/687* (2006.01)

(52) U.S. Cl.
CPC ...... *F27B 17/0025* (2013.01); *H01L 21/67706* (2013.01); *H01L 21/67736* (2013.01); *H01L 21/67778* (2013.01); *H01L 21/68764* (2013.01); *H01L 21/68771* (2013.01); *H01L 2924/0002* (2013.01)
USPC ........... 432/239; 432/141; 432/142; 432/253; 219/394; 219/525

(58) Field of Classification Search
CPC ..................... Y10S 414/135; H01L 21/67745; H01L 21/67167; H01L 21/67796
USPC .......... 432/239, 253, 141–142; 219/391, 394, 219/521, 525
See application file for complete search history.

(56) References Cited

U.S. PATENT DOCUMENTS

| | | | | | |
|---|---|---|---|---|---|
| 2,139,334 | A | * | 12/1938 | Rebois | 99/373 |
| 4,674,621 | A | * | 6/1987 | Takahashi | 198/378 |
| 5,791,895 | A | * | 8/1998 | Kyung et al. | 432/253 |
| 6,368,435 | B1 | * | 4/2002 | Kempf | 156/64 |
| 6,447,232 | B1 | * | 9/2002 | Davis et al. | 414/217.1 |
| 6,702,540 | B2 | * | 3/2004 | Olin | 414/217 |
| 7,925,377 | B2 | * | 4/2011 | Ishikawa et al. | 700/218 |
| 8,172,291 | B2 | * | 5/2012 | Hebiishi | 294/183 |
| 2002/0067978 | A1 | * | 6/2002 | Olin | 414/217 |
| 2005/0035108 | A1 | * | 2/2005 | Eisenhammer et al. | 219/394 |
| 2005/0123386 | A1 | * | 6/2005 | Nishimura et al. | 414/935 |
| 2007/0269297 | A1 | * | 11/2007 | Meulen et al. | 414/222.01 |

* cited by examiner

*Primary Examiner* — Alissa Tomkins
*Assistant Examiner* — John Bargero
(74) *Attorney, Agent, or Firm* — Leong C. Lei

(57) ABSTRACT

A multi-operation wafer baking system includes a chassis; a wafer loading device mounted on the chassis for laterally moving a wafer; a cruciform transportation device mounted on the chassis for receiving a wafer from the wafer loading device and including a base, an elevation platform, and a rotation platform mounted on the elevation platform and having four carrier arms for carrying wafers; an annular baking device mounted on the chassis to oppose the cruciform transportation device and including a central turn table, a plurality of wafer racks, and a plurality of baking tray assemblies functioning to receive wafers from corresponding wafer racks for performing a baking operation on the wafer; and an unloading device mounted on the chassis for receiving baked wafers. This system allows for baking wafers in a multi-operation manner to thereby improve throughput.

1 Claim, 13 Drawing Sheets

MULTI-OPERATION WAFER BAKING SYSTEM

(a) TECHNICAL FIELD OF THE INVENTION

The present invention generally relates to a processing system, and more particularly to a multi-operation wafer baking system, which efficiently loads in wafers to be baked, and can carry out three operations of loading a wafer to a wafer carrier, conveying a wafer to a baking tray for wafer baking operation, and transporting a baked wafer to another wafer carrier at the same time in order to realize a multi-operation process and thus achieve the goal of improving wafer throughput.

(b) DESCRIPTION OF THE PRIOR ART

The development of semiconductor technology places a significant influence of the modem human society. Almost all the electronic products currently used involve semiconductor devices for improving the capabilities of operation, storage, and displaying. In the semiconductor industry, which is of severe competition, the improvement of throughput of semiconductor devices is a key factor for market competition.

The throughput of semiconductor devices is basically relying upon the design of the semiconductor devices and the efficiency and quality control of the manufacturing process of the semiconductor devices.

Wafer is a semi-finished product of a semiconductor device. After the complete processing of the wafer, the wafer can be cut into a plurality of semiconductor dices or chips for subsequent processing including packaging and wire-bonding. In the manufacturing process of wafer, it is often that a wafer is loaded in a baking device and positioned on a baking tray for performance of baking operation on the wafer in which chemical agent, such as photoresist agent, applied to the wafer can be heated by a proper temperature set and realized through the baking tray to carry out physical or chemical conversion, such as curing.

A conventional wafer baking device provides a sequentially arranged linear baking process, wherein all wafers are lined up along a linear path to be sequentially conveyed and loaded onto a baking tray and then removed out of the baking device after being well baked. Thus, all the wafers that are located on the same linear path cannot be baked before the previous wafers are baked. A semiconductor manufacturer may set up multiple baking systems to simultaneously carry out baking operations on multiple wafers. Yet, the installation expense for simultaneously setting up multiple baking systems and the maintenance cost for the multiple baking systems are both increased. Further, these baking system usually occupy a great amount of floor area, so that the workshop must be expanded before multiple baking systems can be installed. Apparently, these conventional baking systems or devices are of extremely high costs.

SUMMARY OF THE INVENTION

In view of the above problems of the conventional baking system that carries out wafers in a single line manner with poor throughput, the present invention aims to provide a multi-operation wafer baking system that carries out wafer baking in a multi-operation manner.

Thus, the primary objective of the present invention is to provide a multi-operation wafer baking system, which efficiently loads wafers to be baked and simultaneously carry out three operations of receiving wafers from a wafer carrier, conveying the wafers into baking trays for baking the wafers, and moving baked wafers to another wafer carrier, so as to provide a multi-operation handling of wafer to improve throughput of wafers.

To achieve the above objective, according to the present invention, a multi-operation wafer baking system is provided, comprising:

a chassis;

a wafer loading device, which is mounted on the chassis for laterally moving a wafer;

a cruciform transportation device, which is mounted on the chassis for receiving a wafer from the wafer loading device and comprises a base, an elevation platform, and a rotation platform, the base being mounted on the chassis, the elevation platform being mounted on the base in a vertically movable manner, the rotation platform being mounted on the elevation platform in a rotatable manner, the rotation platform comprising at least four carrier arms mounted thereon to project radially outward from the rotation platform for carrying wafers;

an annular baking device, which is mounted on the chassis to oppose the cruciform transportation device and comprises a central turn table, a plurality of wafer racks, and a plurality of baking tray assemblies, the central turn table being rotatably mounted on the chassis, the plurality of wafer racks being radially oriented and circumferentially arranged along a circumference of the central turn table for picking up wafers transported by the cruciform transportation device, the plurality of baking tray assemblies being mounted on the chassis and positioned outside and circumferentially surrounding the central turn table and the wafer racks, each of the baking tray assemblies functioning to receive a wafer supplied from a corresponding one of the wafer racks for performing a baking operation on the wafer; and an unloading device, which is mounted on the chassis for receiving a baked wafer from the cruciform transportation device.

With the above described arrangement, the cruciform transportation device is operated to have the carrier arms upward moved, rotated, and downward moved for hand-over of wafer (transfer of wafer) with respect to the wafer loading device, the annular baking device, and the unloading device. Specifically, the 6-o'clock-direction carrier arm performs wafer hand-over with respect to the wafer loading device to receive a wafer from the wafer loading device; the 12-o'clock-direction carrier arm performs wafer hand-over with respect to the 6-o'clock-direction wafer rack of the annular baking device to transfer a wafer to the corresponding wafer rack; and the three-o'clock-direction carrier arm performs wafer hand-over with respect to the unloading device for transferring a well-baked wafer to the unloading device. Further, the central turn table of the annular baking device is rotatable to selectively move the wafer racks to various ones of the baking tray assemblies, so that a wafer that is carried by each of the wafer racks can be sequentially baked at the baking tray assemblies and the wafers carried by the wafer racks can be simultaneously baked but selectively at various temperatures (for each associated baking component can be set at different temperature). As such, the multi-operation wafer baking system according to the present invention can simultaneously carry out operations of wafer loading, wafer baking (multiple wafers being baked at the same time), and conveying baked wafers to the unloading device in a multi-operation fashion. Therefore, the wafer processing speed realized by the present invention can be multiple times of the conventional linear wafer baking facility and a single set of installation can replace multiple sets of the conventional linear baking systems, so that the present invention is of economic efficiency and helps saving installation expense of workshop. Further, the cruciform transportation device and the annular baking device of the multi-operation wafer baking system according to the present invention are generally of a circular configuration to cooperate with each other and can be perfectly confined within the internal space of the rectangular configuration of the chassis, so that the amount of space occupied is much less than that of the conventional rectangular or L-shaped linear baking facility. In summary, the multi-operation wafer baking system according to the present invention can be operated in a multi-operation manner for multiple-times increase of operation efficiency and provides a circular arrangement of the system to help reducing the amount of space occupied so as to possess both high efficiency and low costs.

The rotation platform of the cruciform transportation device may sequentially perform upward movement, rotation, and downward movement for picking up, moving, and positioning wafers.

The cruciform transportation device is locate at the 6-o'clock direction of the annular baking device and the four carrier arms are pre-located at the 6-o'clock, 9-o'clock, 12-o'clock, and 3-o'clock directions of the rotation platform, wherein the carrier arm that is originally located at the 12-o'clock direction is moved upward to pick up a baked wafer from the wafer rack at the 6-o'clock direction, rotated to the 3-o'clock direction, and then moved downward to transfer the baked wafer to the unloading device. The wafer that is originally located at the 9-o'clock direction is moved upward and rotated to the 12-o'clock direction to be located above the 6-o'clock-direction wafer rack, and is then moved downward to transfer the wafer to the wafer rack. The carrier arm that is originally located at the 6-o'clock direction is moved upward to pick up a wafer from the wafer loading device, and then rotated to the 9-o'clock direction and downward moved.

Each of the wafer racks comprises a fixing mount, a driving device, and two pick-up arms. The fixing mount is fixed on the central turn table. The driving device is mounted on the fixing mount. The two pick-up arms are mounted on the fixing mount in a manner that each is rotatable about an axis and are coupled to the driving device, whereby the two pick-up arms are rotatable in a symmetric manner to reach horizontal positions for carrying a wafer thereon or to reach vertical positions for releasing and positioning the wafer.

Each pick-up arm of each of the wafer racks forms a plurality of receiving slots, which are of various sizes, for receiving and carrying wafers of different sizes.

Each of the baking tray assemblies comprises a seat, a baking tray, and a plurality of ejection pins. The seat is mounted on the chassis and the baking tray is mounted on the seat. The plurality of ejection pins is arranged on the baking tray in a vertically extendible manner for selectively extending beyond the baking tray to raise a wafer or retracting back into the baking tray for lowering and positioning a wafer on a surface of the baking tray.

The number of the baking tray assemblies is less than that of the wafer racks by at least one, so that two of the baking tray assemblies that are adjacent to each other form a hand-over space therebetween for hand-over of wafer between the cruciform transportation device and a corresponding one of the wafer racks.

Alternatively, the number of the baking tray assemblies is less than that of the wafer racks by at least two, whereby besides the hand-over space formed between two adjacent ones of the baking tray assemblies, two other ones of the baking tray assemblies that are adjacent to each other also form a buffering space therebetween for eliminating a possible abrupt change of temperature for baking wafers.

The baking tray of each of the baking tray assemblies comprises at least one group of raising blocks arranged thereon for supporting a wafer above the baking tray in a floating manner.

All the baking trays are essentially of different temperatures.

The wafer loading device comprises at least one wafer carriage case, a belt conveyor device, and a lateral transportation device. The wafer carriage case is mounted on the chassis in a releasable manner and is located at the 9-o'clock direction of the cruciform transportation device. The wafer carriage case forms a plurality of wafer compartments for respectively receiving therein wafers. The belt conveyor device is mounted on the chassis between the wafer carriage case and the cruciform transportation device for conveying the wafers of the wafer carriage case. The lateral transportation device comprises a slide support, a slide member, and an extendible arm. The slide support is fixedly mounted on the chassis and is located at the 6-o'clock direction of the cruciform transportation device. The slide support comprises a slide rail mounted thereon and the slide member is mounted on the slide rail of the slide support in a laterally slidable manner. The slide member comprises an extension driving assembly mounted thereon. The extendible arm is mounted to the extension driving assembly and is extendable in a longitudinal direction with respect to the slide support in order to transfer the wafer to a 6-o'clock-direction carrier arm of the cruciform transportation device.

The unloading device comprises at wafer carriage case and a belt conveyor device. The wafer carriage case is mounted on the chassis in a releasable manner and is located at the 3-o'clock direction of the cruciform transportation device. The belt conveyor device is mounted on the chassis between the cruciform transportation device 40 and the wafer carriage case.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
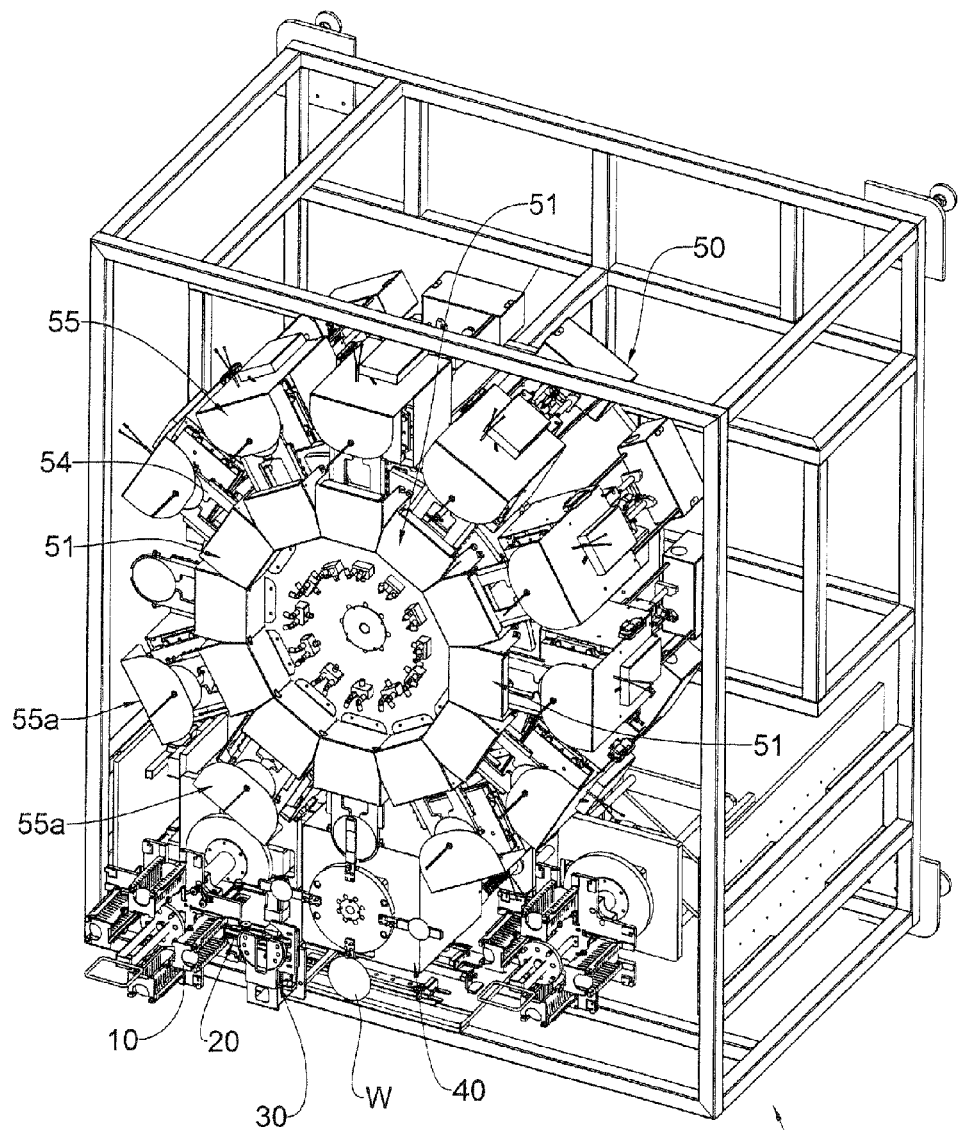
FIG. 1 is a perspective view showing a multi-operation wafer baking system according to the present invention.
Figure 2:
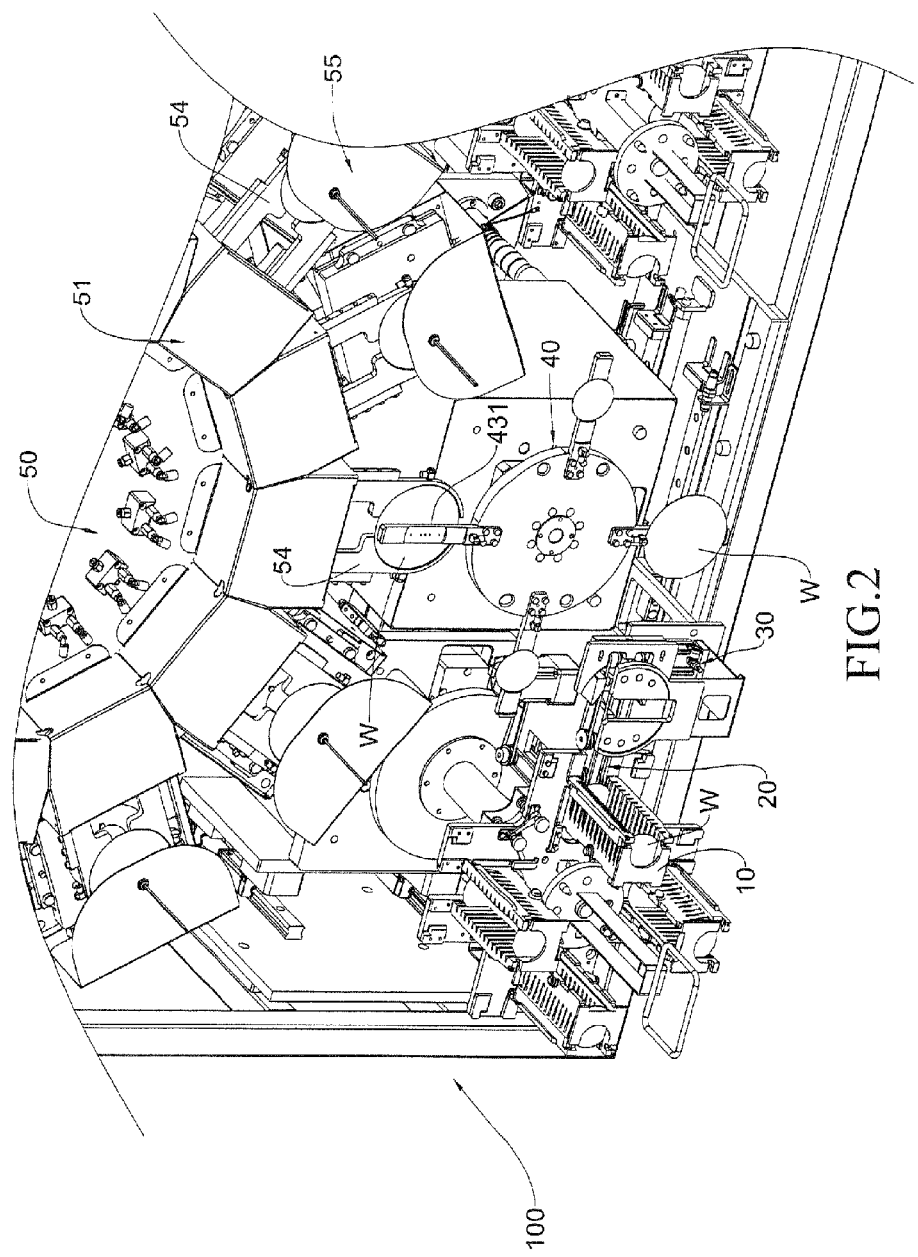
FIG. 2 is an enlarged view of a portion of the multi-operation wafer baking system according to the present invention.
Figure 3:
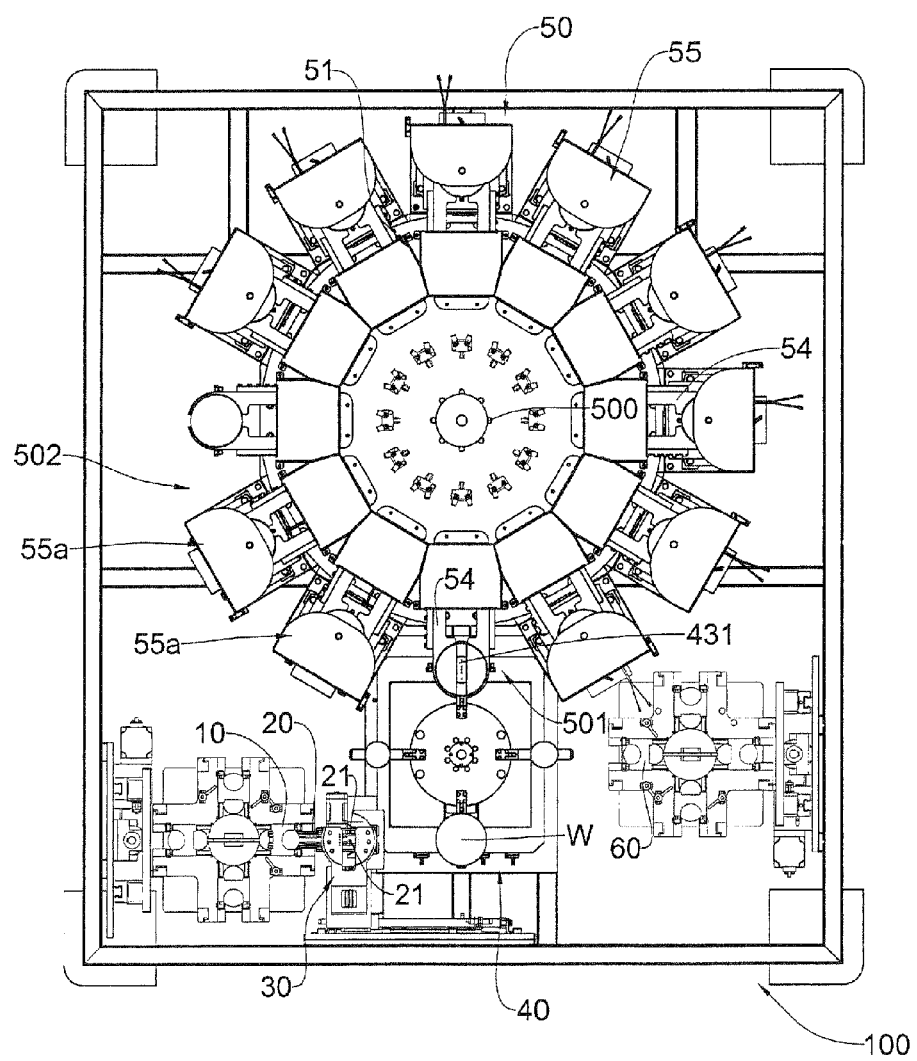
FIG. 3 is a top plan view of the multi-operation wafer baking system according to the present invention.

Referring to FIGS. 1-3, the present invention provides a multi-operation wafer baking system, which comprises: a chassis 100, a wafer loading device, a cruciform transportation device 40, an annular baking device 50, and an unloading device.

The chassis 100 is of a rectangular parallelepiped configuration for the purpose of saving space and enhancing space arrangement.

Figure 4:
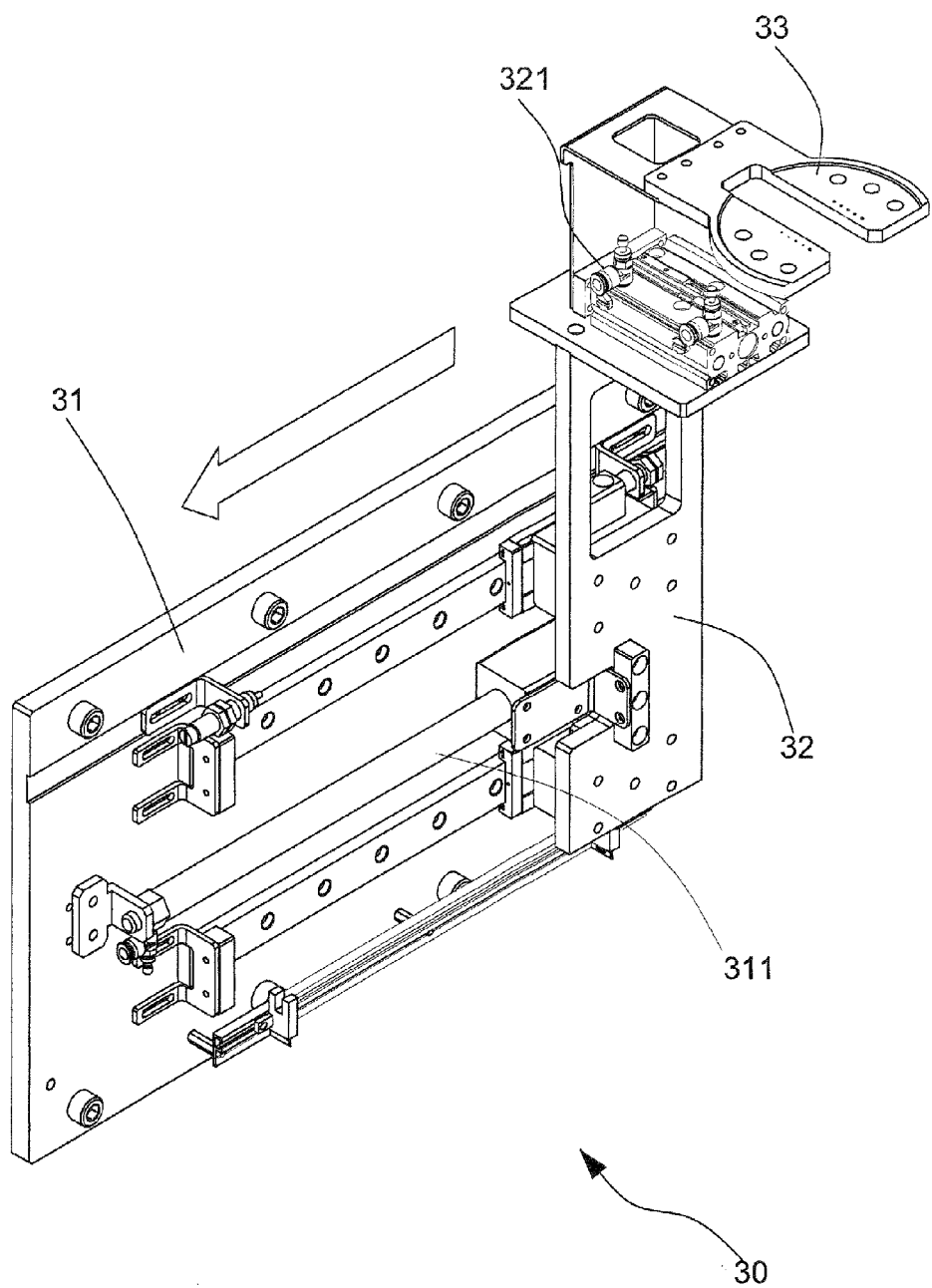
FIG. 4 is a perspective view showing a lateral transportation device of the multi-operation wafer baking system according to the present invention.
Figure 5:
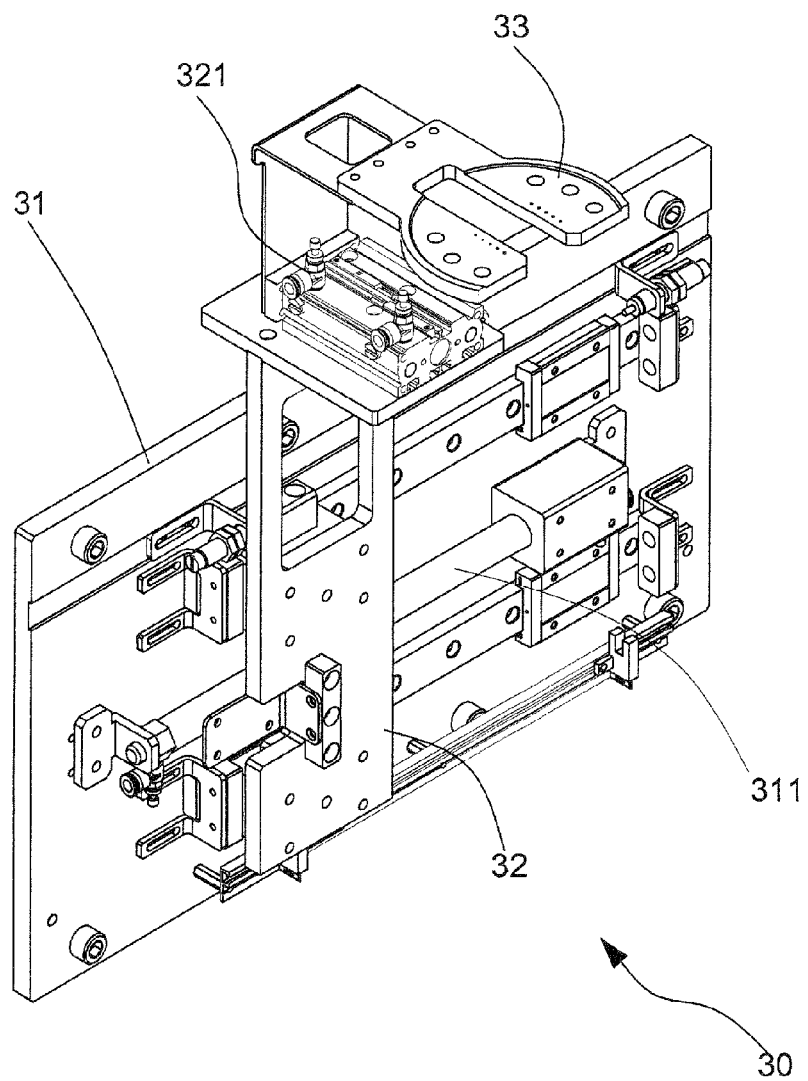
FIG. 5 is a perspective view showing the operation of the lateral transportation device of the multi-operation wafer baking system according to the present invention.

The wafer loading device is mounted on the chassis 100 for laterally moving a wafer W. Further referring to FIGS. 4 and 5, the wafer loading device comprises at least one wafer carriage case 10, a belt conveyor device 20, and a lateral transportation device 30.

The wafer carriage case 10 is mounted on the chassis 100 in a releasable manner and is located at the 9-o'clock direction of the cruciform transportation device 40. The wafer carriage case 10 forms a plurality of wafer compartments for respectively receiving therein wafers.

Figure 13:
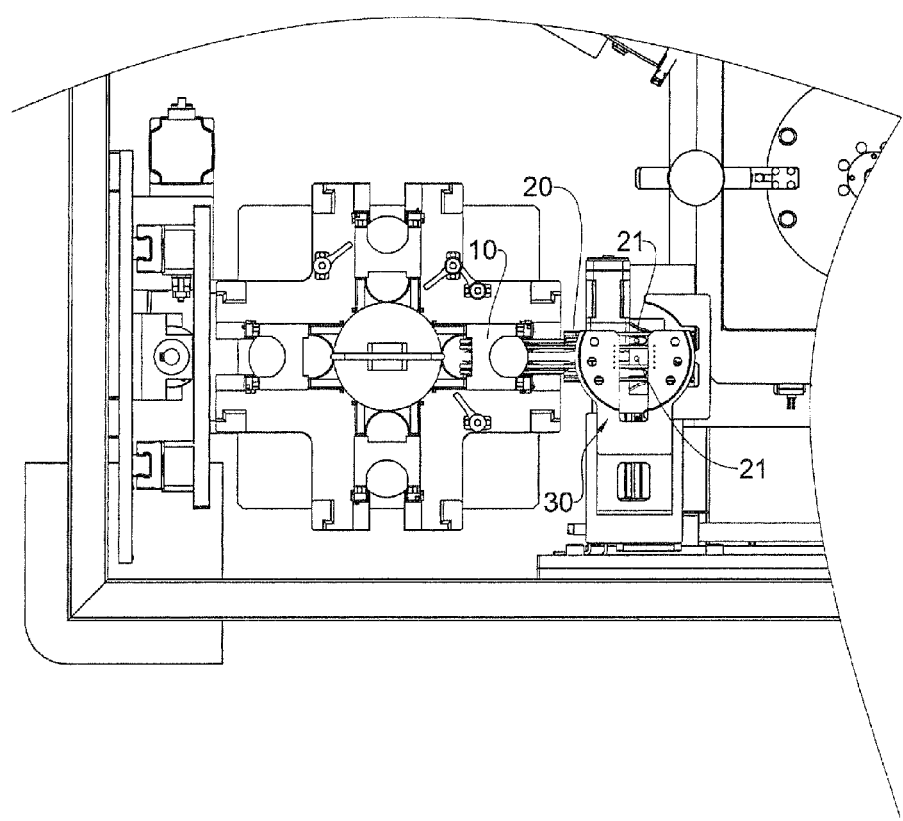
FIG. 13 shows details around push pins of a belt conveyor device of a wafer loading device according to the present invention.

The belt conveyor device 20 is mounted on the chassis 100 between the wafer carriage case 10 and the cruciform transportation device 40 for conveying the wafers of the wafer carriage case 10. Further, the belt conveyor device comprises a plurality of vertically extendible/retractable push pins 21 for pushing to raise the wafer W that is conveyed to the cruciform transportation device 40 to allow for subsequent transportation of the wafer W by the lateral transportation device 30. Details around the push pins 21 are shown in FIG. 13.

The lateral transportation device 30 comprises a slide support 31, a slide member 32, and an extendible arm 33. The slide support 31 is fixedly mounted on the chassis 100 and is located at the 6-o'clock direction of the cruciform transportation device 40. The slide support 31 comprises a slide rail 311 mounted thereon and the slide member 32 is mounted on the slide rail 311 of the slide support 31 in a laterally slidable manner. The slide member 32 comprises an extension driving assembly 321 mounted thereon. The extendible arm 33 is mounted to the extension driving assembly 321 and is extendable in a longitudinal direction with respect to the slide support 31 (for selectively extending outward to receive and pick up a wafer W after the wafer W has been pushed upward by the push pins 21), in order to transfer the wafer W to a 6-o'clock-direction carrier arm 431 of the cruciform transportation device 40.

Figure 6:
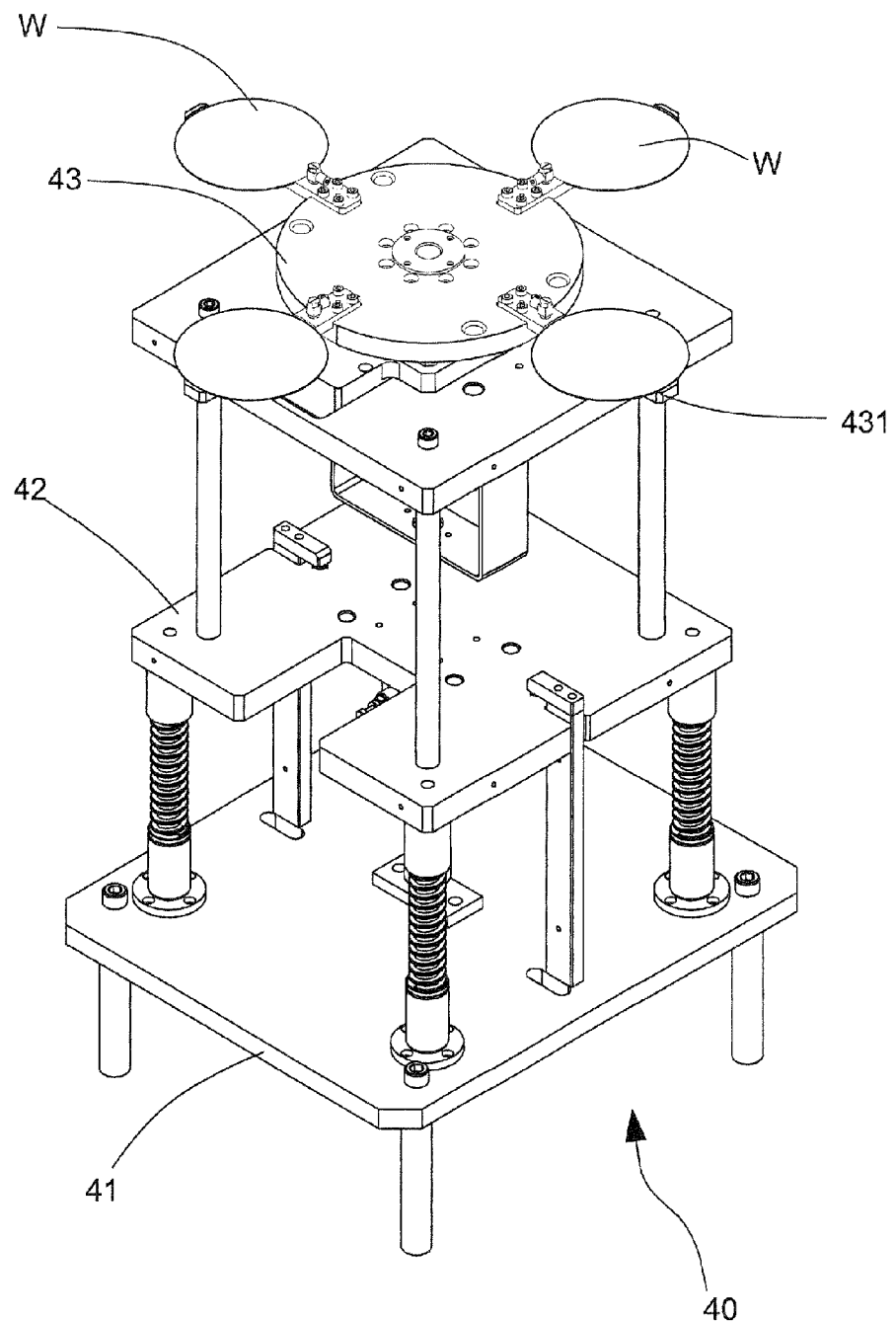
FIG. 6 is a perspective view showing a cruciform transportation device of the multi-operation wafer baking system according to the present invention.
Figure 7:
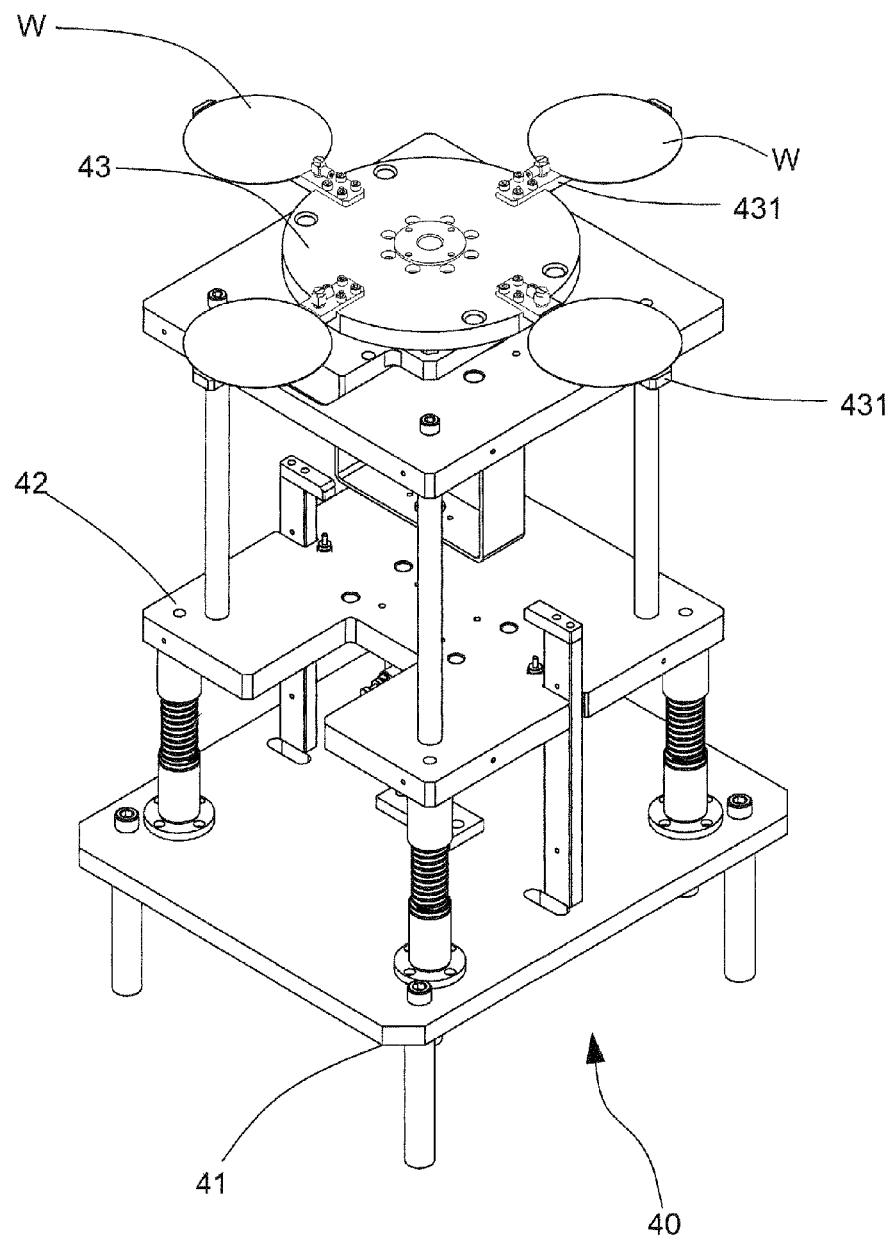
FIG. 7 is a perspective view sowing the operation of the cruciform transportation device of the multi-operation wafer baking system according to the present invention.

Referring to FIGS. 6 and 7, the cruciform transportation device 40 is mounted on the chassis 100 for receiving a wafer W from the wafer loading device and comprises a base 41, an elevation platform 42, and a rotation platform 43. The base 41 is mounted on the chassis 100. The elevation platform 42 is mounted on the base 41 in a vertically movable manner. The rotation platform 43 is mounted on the elevation platform 42 in a rotatable manner and the rotation platform 43 comprises at least four carrier arms 431 mounted thereon to project radially outward from the rotation platform 43 for carrying wafers W. Further, the rotation platform 43 of the cruciform transportation device 40 may sequentially perform upward movement, rotation, and downward movement for picking up, moving, and positioning wafers W.

The annular baking device 50 is mounted on the chassis 100 to oppose the cruciform transportation device 40 and comprises a central turn table 500, a plurality of wafer racks 51, and a plurality of baking tray assemblies 55, 55a.

The central turn table 500 is rotatably mounted on the chassis 100.

Figure 8:
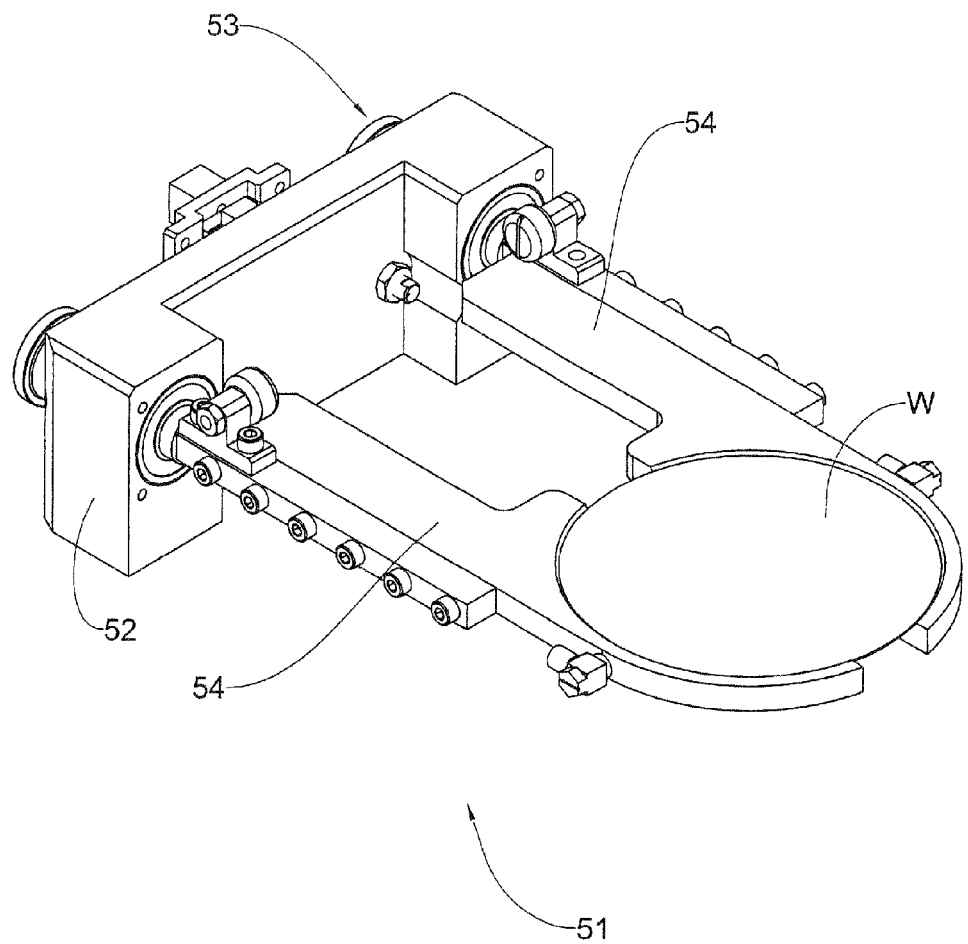
FIG. 8 is a perspective view showing a wafer rack of the multi-operation wafer baking system according to the present invention.
Figure 9:
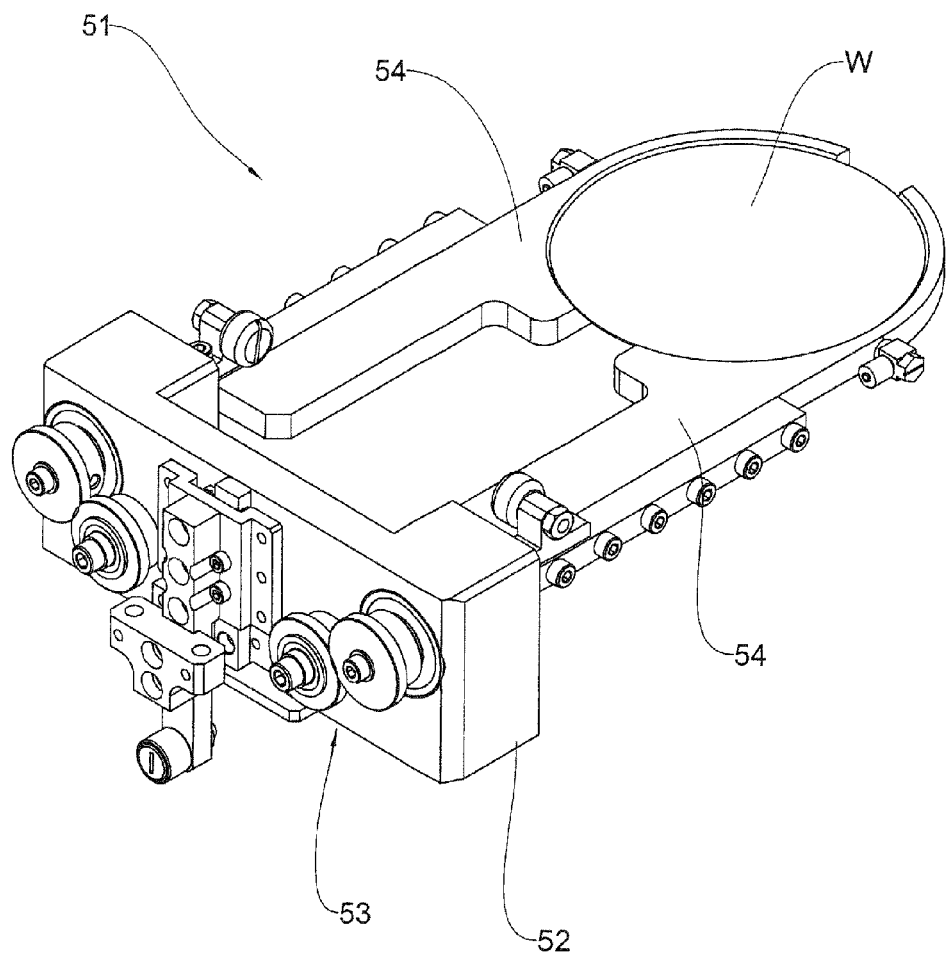
FIG. 9 is another perspective view of the wafer rack of the multi-operation wafer baking system according to the present invention.
Figure 10:
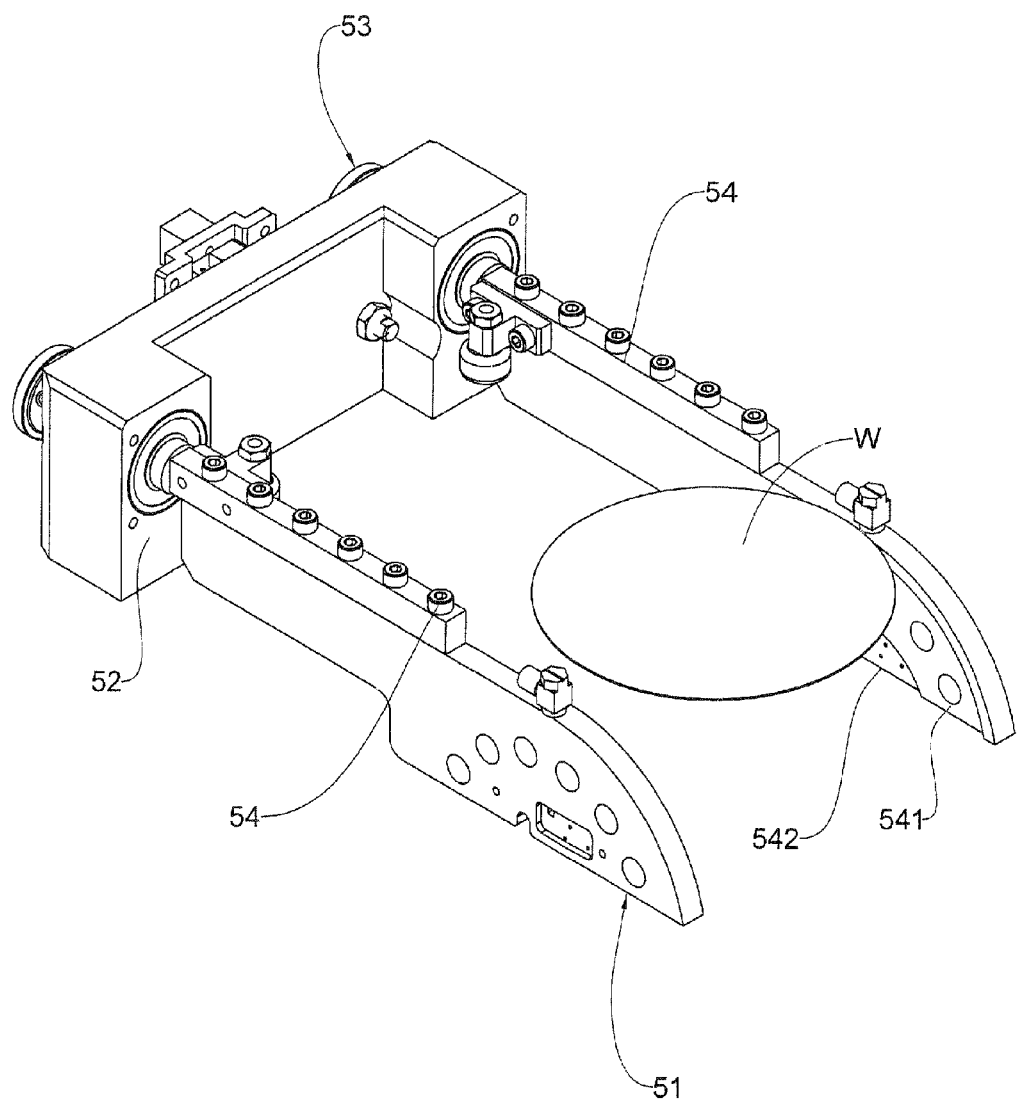
FIG. 10 is a perspective view showing the operation of the wafer rack of the multi-operation wafer baking system according to the present invention.

Referring to FIGS. 8-10, the plurality of wafer racks 51 is radially oriented and circumferentially arranged along a circumference of the central turn table 500 for picking up wafers W transported by the cruciform transportation device 40. Further, each of the wafer racks 51 comprises a fixing mount 52, a driving device 53, and two pick-up arms 54. The fixing mount 52 is fixed on the central turn table 500. The driving device 53 is mounted on the fixing mount 52. The two pick-up arms 54 are mounted on the fixing mount 52 in a manner that each is rotatable about an axis and are coupled to the driving device 53, whereby the two pick-up arms 54 are rotatable in a symmetric manner to reach horizontal positions for carrying a wafer W thereon or to reach vertical positions for releasing and positioning the wafer W. Further, each pick-up arm 54 of each of the wafer racks 51 forms a plurality of receiving slots 541, 542, which are of various sizes, for receiving and carrying wafers W of different sizes.

Figure 11:
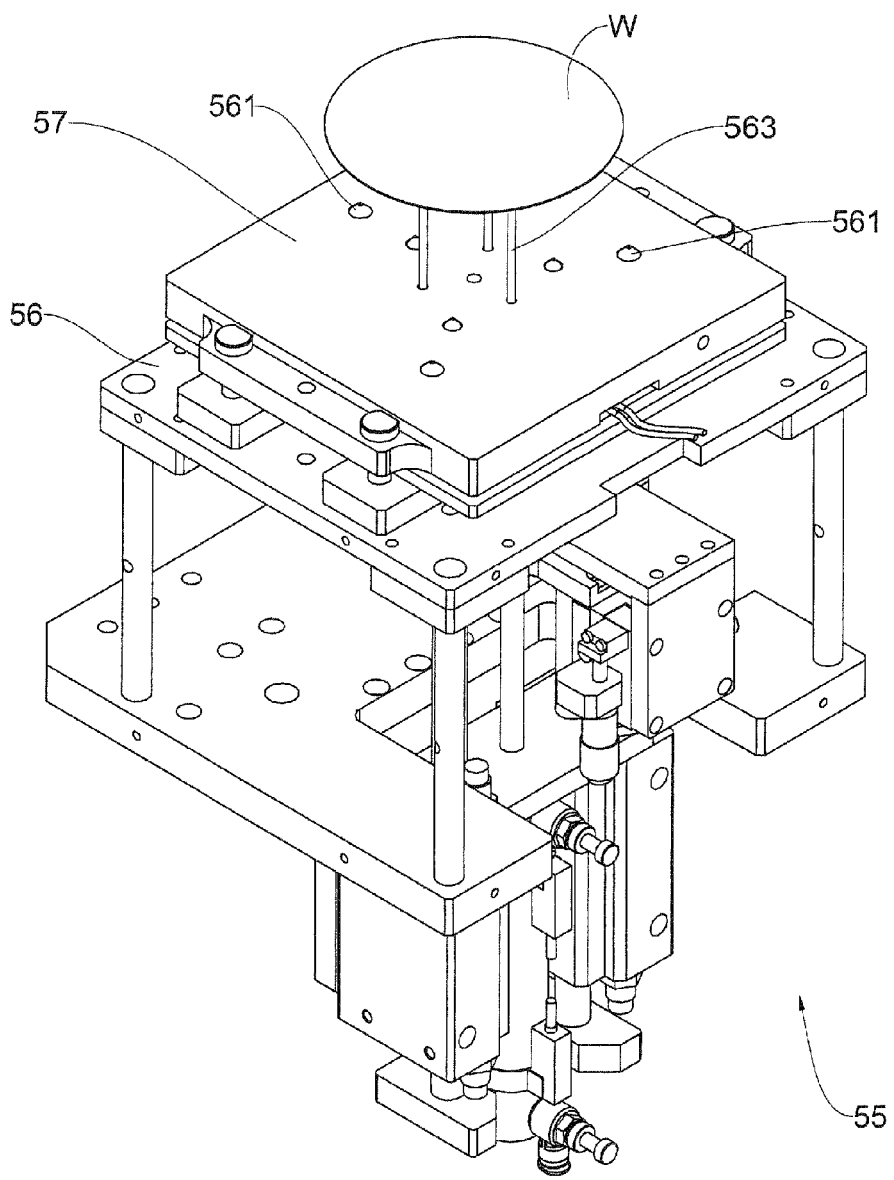
FIG. 11 is perspective view showing a baking tray assembly of the multi-operation wafer baking system according to the present invention.
Figure 12:
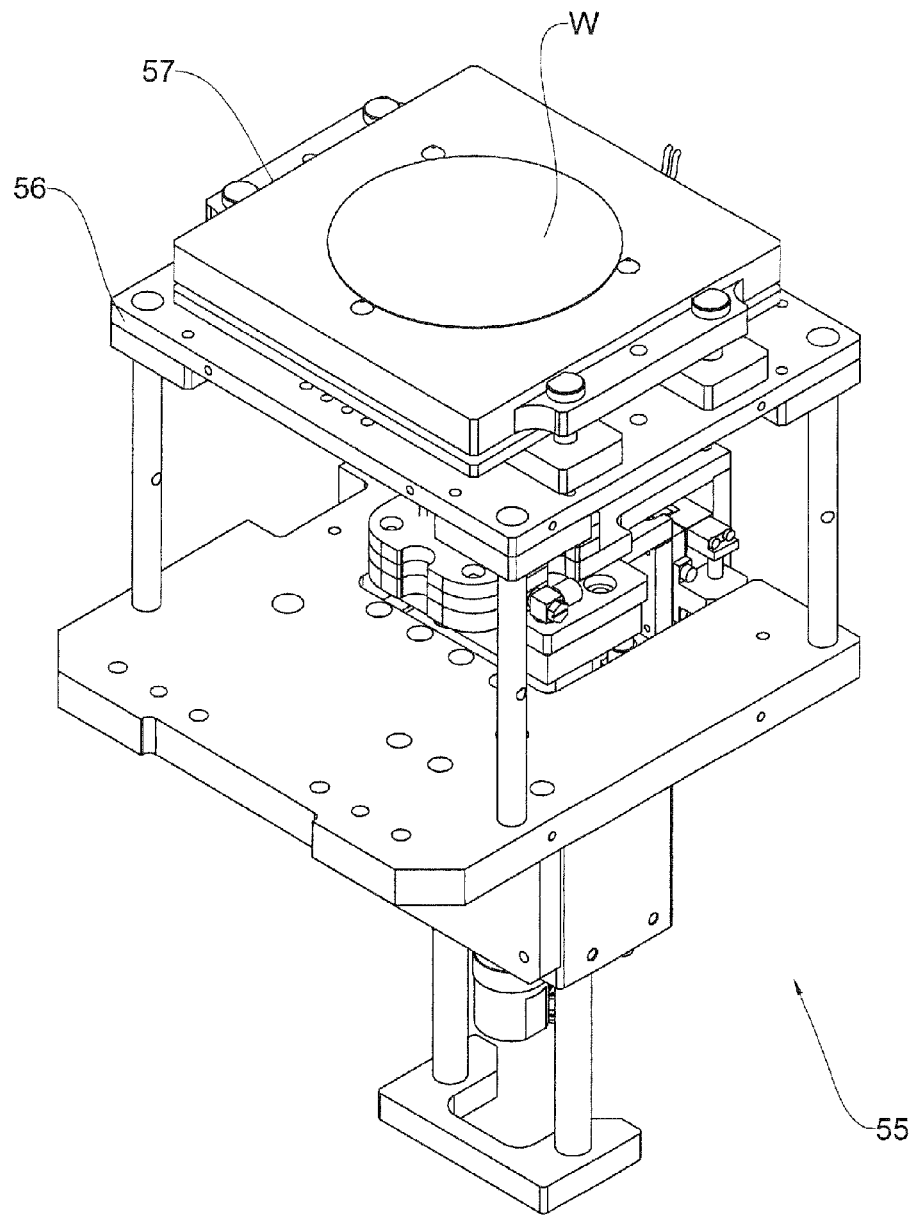
FIG. 12 is a perspective view showing the operation of the baking tray assembly of the multi-operation wafer baking system according to the present invention.

Also referring to FIGS. 11 and 12, the plurality of baking tray assemblies 55, 55a is mounted on the chassis 100 and is positioned outside and circumferentially surround the central turn table 500 and the wafer racks 51. Each of the baking tray assemblies 55, 55a functions to receive a wafer W supplied from a corresponding one of the wafer racks 51 for performing a baking operation on the wafer W. Further, the baking tray assemblies 55, 55a are generally divided as high-temperature tray assemblies 55 that have a temperature higher than the room temperature and low-temperature tray assemblies 55a that have a temperature lower than the room temperature.

In a preferred embodiment of the present invention, the cruciform transportation device 40 is locate at the 6-o'clock direction of the annular baking device 50 and the four carrier arms 431 are pre-located at the 6-o'clock, 9-o'clock, 12-o'clock, and 3-o'clock directions of the rotation platform 43, wherein the carrier arm 431 that is originally located at the 12-o'clock direction is moved upward to pick up a baked wafer W from the wafer rack 51 at the 6-o'clock direction, rotated to the 3-o'clock direction, and then moved downward to transfer the baked wafer W to the unloading device. The wafer W that is originally located at the 9-o'clock direction is moved upward and rotated to the 12-o'clock direction to be located above the 6-o'clock-direction wafer rack 51, and is then moved downward to transfer the wafer W to the wafer rack 51. The carrier arm 431 that is originally located at the 6-o'clock direction is moved upward to pick up a wafer W from the wafer loading device, and then rotated to the 9-o'clock direction and downward moved.

In a preferred embodiment of the present invention, each of the baking tray assemblies 55, 55a comprises a seat 56, a baking tray 57, and a plurality of ejection pins 563. The seat 56 is mounted on the chassis 100 and the baking tray 57 is mounted on the seat 56. The plurality of ejection pins 563 is arranged on the baking tray 57 in a vertically extendible manner for selectively extending beyond the baking tray 57 to raise a wafer W or retracting back into the baking tray 57 for lowering and positioning a wafer W on a surface of the baking tray 57. Further, the baking tray 57 of each of the baking tray assemblies 55, 55a comprises at least one group of raising blocks 561 arranged thereon for supporting a wafer W above the baking tray in a floating manner.

In a preferred embodiment, the number of the baking tray assemblies 55, 55a is less than that of the wafer racks 51 by at least one, so that two of the baking tray assemblies 55, 55a that are adjacent to each other form a hand-over space 501 therebetween for hand-over of wafer between the cruciform transportation device 40 and a corresponding one of the wafer racks 51. In another embodiment, the number of the baking tray assemblies 55, 55a is less than that of the wafer racks 51 by at least two, whereby besides the hand-over space 501 formed between two adjacent ones of the baking tray assemblies 55, 55a, two other ones of the baking tray assemblies 55, 55a that are adjacent to each other also form a buffering space 502 therebetween for eliminating a possible abrupt change of temperature for baking wafers W. Further, all the baking trays are essentially of different temperatures, which can be progressively increased or progressively decreased for handling different chemical agents applied to wafers W.

The unloading device is mounted on the chassis 100 for receiving well-baked wafers W from the cruciform transportation device 40.

In a preferred embodiment of the present invention, the unloading device comprises at least one wafer carriage case 60 and a belt conveyor device. The wafer carriage case 60 is mounted on the chassis 100 in a releasable manner and is located at the 3-o'clock direction of the cruciform transportation device 40. The belt conveyor device is mounted on the chassis 100 between the cruciform transportation device 40 and the wafer carriage case 60.

With the above described arrangement, the cruciform transportation device 40 is operated to have the carrier arms 431 upward moved, rotated, and downward moved for hand-over of wafer (transfer of wafer) with respect to the wafer loading device, the annular baking device 50, and the unloading device. Specifically, the 6-o'clock-direction carrier arm 431 performs wafer hand-over with respect to the wafer loading device to receive a wafer W from the wafer loading device; the 12-o'clock-direction carrier arm 431 performs wafer hand-over with respect to the 6-o'clock-direction wafer rack 51 of the annular baking device 50 to transfer a wafer to the corresponding wafer rack 51; and the three-o'clock-direction carrier arm 431 performs wafer hand-over with respect to the unloading device for transferring a well-baked wafer W to the unloading device. Further, the central turn table 500 of the annular baking device 50 is rotatable to selectively move the wafer racks to various ones of the baking tray assemblies 55, 55a, so that a wafer that is carried by each of the wafer racks 51 can be sequentially baked at the baking tray assemblies 55, 55a and the wafers W carried by the wafer racks 51 can be simultaneously baked but selectively at various temperatures (for each associated baking component can be set at different temperature). As such, the multi-operation wafer baking system according to the present invention can simultaneously carry out operations of wafer loading, wafer baking (multiple wafers being baked at the same time), and conveying baked wafers W to the unloading device in a multi-operation fashion. Therefore, the wafer processing speed realized by the present invention can be multiple times of the conventional linear wafer baking facility and a single set of installation can replace multiple sets of the conventional linear baking systems, so that the present invention is of economic efficiency and helps saving installation expense of workshop. Further, the cruciform transportation device 40 and the annular baking device 50 of the multi-operation wafer baking system according to the present invention are generally of a circular configuration to cooperate with each other and can be perfectly confined within the internal space of the rectangular configuration of the chassis 100, so that the amount of space occupied is much less than that of the conventional rectangular or L-shaped linear baking facility. In summary, the multi-operation wafer baking system according to the present invention can be operated in a multi-operation manner for multiple-times increase of operation efficiency and provides a circular arrangement of the system to help reducing the amount of space occupied so as to possess both high efficiency and low costs.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

We claim:

1. A multi-operation wafer baking system, comprising:
   a chassis;
   a wafer loading device, which is mounted on the chassis for moving a wafer with respect to the chassis;
   a cruciform transportation device, which is mounted on the chassis for receiving a wafer from the wafer loading device and comprises a base, an elevation platform, and a rotation platform, the base being mounted on the chassis, the elevation platform being mounted on the base in a vertically movable manner, the rotation platform being mounted on the elevation platform in a rotatable manner, the rotation platform comprising at least four carrier arms mounted thereon to project radially outward from the rotation platform for carrying wafers;
   an annular baking device, which is mounted on the chassis to oppose the cruciform transportation device and comprises a central turn table, a plurality of wafer racks, and a plurality of baking tray assemblies, the central turn table being rotatably mounted on the chassis, the plurality of wafer racks being radially oriented and circumferentially arranged along a circumference of the central turn table for picking up wafers transported by the cruciform transportation device, the plurality of baking tray assemblies being mounted on the chassis and positioned outside and circumferentially surrounding the central turn table and the wafer racks, each of the baking tray assemblies functioning to receive a wafer supplied from a corresponding one of the wafer racks for performing a baking operation on the wafer, wherein the baking tray assemblies are isolated from each other and are set at different baking temperatures so that the wafer is sequentially conveyed through the baking tray assemblies and the baking operation of the wafer is carried out in compliance with a baking temperature variation mode determined by the different baking temperatures of the baking tray assemblies; and an unloading device, which is mounted on the chassis for receiving a baked wafer from the cruciform transportation device;

wherein the rotation platform of the cruciform transportation device sequentially performs upward movement, rotation, and downward movement for picking up, moving, and positioning wafers;

wherein the cruciform transportation device is locate at 6-o'clock direction of the annular baking device and the four carrier arms are pre-located at 6-o'clock, 9-o'clock, 12-o'clock, and 3-o'clock directions of the rotation platform, and wherein the carrier arm that is originally located at the 12-o'clock direction is moved upward to pick up a baked wafer from the wafer rack at 6-o'clock direction, rotated to 3-o'clock direction, and then moved downward to transfer the baked wafer to the unloading device; the wafer that is originally located at 9-o'clock direction is moved upward and rotated to the 12-o'clock direction to be located above the 6-o'clock-direction wafer rack, and is then moved downward to transfer the wafer to the wafer rack; and the carrier arm that is originally located at 6-o'clock direction is moved upward to pick up a wafer from the wafer loading device, and then rotated to 9-o'clock direction and downward moved;

wherein each of the wafer racks comprises a fixing mount, a driving device, and two pick-up arms, the fixing mount being fixed on the central turn table, the driving device being mounted on the fixing mount, the two pick-up arms being mounted on the fixing mount in a manner that each is rotatable about an axis and is coupled to the driving device, whereby the two pick-up arms are rotatable in a symmetric manner to selectively reach horizontal positions for carrying a wafer thereon or to reach vertical positions for releasing and positioning the wafer, the axes about which the pick-up arms are rotatable being spaced from each other in such a way that when the pick-up arms are in the vertical positions, a distance is defined between the pick-up arms and is sufficiently large to allow the wafer to pass through the distance between the pick-up arms and is thus released;

wherein each of the pick-up arms of each of the wafer racks forms a plurality of receiving slots, the receiving slots of the pick-up arms corresponding to each other and being of arc shapes so that when pick-up arms are at the horizontal positions, the corresponding ones of the arc shapes of the receiving slots collectively forming a circular recess, the circular recesses formed by arc shapes of the plurality of receiving slots having different sizes for snugly receiving wafers of different sizes therein;

wherein each of the baking tray assemblies comprises a seat, a baking tray, and a plurality of ejection pins, the seat being mounted on the chassis, the baking tray being mounted on the seat, the plurality of ejection pins being arranged on the baking tray in a vertically extendible manner for selectively extending beyond the baking tray to raise a wafer or retracting back into the baking tray for lowering and positioning a wafer on a surface of the baking tray;

wherein the number of the baking tray assemblies is less than that of the wafer racks by at least one, so that two of the baking tray assemblies that are adjacent to each other form a hand-over space therebetween for hand-over of wafer between the cruciform transportation device and a corresponding one of the wafer racks;

wherein the number of the baking tray assemblies is less than that of the wafer racks by at least two, whereby a hand-over space is formed between two adjacent ones of the baking tray assemblies and a buffering space is formed between two other ones of the baking tray assemblies that are adjacent to each other for eliminating a possible abrupt change of temperature for baking wafers;

wherein the baking tray of each of the baking tray assemblies comprises at least one group of raising blocks arranged thereon for supporting a wafer above the baking tray in a floating manner;

wherein the wafer loading device comprises at least one wafer carriage case, a belt conveyor device, and a lateral transportation device, the wafer carriage case being mounted on the chassis in a releasable manner and being located at 9-o'clock direction of the cruciform transportation device, the wafer carriage case forming a plurality of wafer compartments for respectively receiving therein wafers, the belt conveyor device being mounted on the chassis between the wafer carriage case and the cruciform transportation device for conveying wafers of the wafer carriage case, the lateral transportation device comprising a slide support, a slide member, and an extendible arm the slide support being fixedly mounted on the chassis and located at 6-o'clock direction of the cruciform transportation device, the slide support comprising a slide rail mounted thereon, the slide member being mounted on the slide rail of the slide support in a laterally slidable manner, the slide member comprising an extension driving assembly mounted thereon, the extendible arm being mounted to the extension driving assembly and being extendable in a longitudinal direction with respect to the slide support in order to transfer a wafer to a 6-o'clock-direction carrier arm of the cruciform transportation device; and wherein the unloading device comprises a wafer carriage case and a belt conveyor device, the wafer carriage case being mounted on the chassis in a releasable manner and located at 3-o'clock direction of the cruciform transportation device, the belt conveyor device being mounted on the chassis between the cruciform transportation device and the wafer carriage case.

* * * * *